United States Patent
Seidel et al.

(10) Patent No.: US 6,902,624 B2
(45) Date of Patent: Jun. 7, 2005

(54) MASSIVELY PARALLEL ATOMIC LAYER DEPOSITION/CHEMICAL VAPOR DEPOSITION SYSTEM

(75) Inventors: Thomas E. Seidel, Sunnyvale, CA (US); Adrian Jansz, Fremon, CA (US); Jurek Puchacz, Pleasanton, CA (US); Ken Doering, San Jose, CA (US)

(73) Assignee: Genus, Inc., Sunnyvale, CA (US)

( * ) Notice: Subject to any disclaimer, the term of this patent is extended or adjusted under 35 U.S.C. 154(b) by 107 days.

(21) Appl. No.: 10/282,609

(22) Filed: Oct. 29, 2002

(65) Prior Publication Data

US 2003/0109094 A1 Jun. 12, 2003

Related U.S. Application Data

(60) Provisional application No. 60/346,005, filed on Oct. 29, 2001.

(51) Int. Cl.[7] ............................. C33C 16/00; C23F 1/00; H01L 21/306
(52) U.S. Cl. .................. 118/719; 118/715; 156/345.31; 156/345.32; 156/345.33
(58) Field of Search ................................ 118/715–733; 156/345.31, 345.32; 204/298.25, 298.35; 414/939

(56) References Cited

U.S. PATENT DOCUMENTS

| | | | | |
|---|---|---|---|---|
| 5,414,244 A | * | 5/1995 | Imahashi ..................... | 219/497 |
| 5,711,811 A | * | 1/1998 | Suntola et al. .............. | 118/719 |
| 6,042,652 A | * | 3/2000 | Hyun et al. .................. | 118/719 |
| 6,174,377 B1 | | 1/2001 | Doering et al. | |
| 6,383,330 B1 | * | 5/2002 | Raaijmakers ................ | 118/715 |
| 6,454,863 B1 | * | 9/2002 | Halpin ........................ | 118/725 |
| 6,572,705 B1 | * | 6/2003 | Suntola et al. .............. | 118/702 |
| 6,630,030 B1 | * | 10/2003 | Suntola et al. .............. | 118/728 |
| 6,630,201 B2 | * | 10/2003 | Chiang et al. ......... | 427/255.28 |
| 2002/0108570 A1 | * | 8/2002 | Lindfors ...................... | 118/715 |
| 2003/0075273 A1 | * | 4/2003 | Kilpela et al. .......... | 156/345.33 |
| 2003/0121469 A1 | * | 7/2003 | Lindfors et al. ............. | 117/105 |

FOREIGN PATENT DOCUMENTS

| | | | | |
|---|---|---|---|---|
| EP | 0 959 150 A2 | 11/1999 | | |
| EP | 0 959 150 A3 | 7/2002 | | |
| JP | 2000144430 | 5/2000 | | |
| JP | 2000195925 A | * 7/2000 | ........... | H01L/21/68 |
| WO | WO 9617107 A1 | * 6/1996 | ........... | C23C/16/44 |
| WO | WO 9901595 A1 | * 1/1999 | ........... | C30B/25/14 |
| WO | WO 00/25347 | 5/2000 | | |
| WO | WO 02/073664 A1 | 9/2002 | | |

OTHER PUBLICATIONS

International Search Report for PCT/US 02/34714, mailed Apr. 7, 2003 (9 pages).

* cited by examiner

Primary Examiner—Parviz Hassanzadeh
Assistant Examiner—Karla Moore
(74) Attorney, Agent, or Firm—Blakely, Sokoloff, Taylor & Zafman LLP

(57) ABSTRACT

A method and apparatus for the use of individual vertically stacked ALD or CVD reactors. Individual reactors are independently operable and maintainable. The gas inlet and output are vertically configured with respect to the reactor chamber for generally axi-symmetric process control. The chamber design is modular in which cover and base plates forming the reactor have improved flow design.

18 Claims, 8 Drawing Sheets

MASSIVELY PARALLEL ATOMIC LAYER DEPOSITION/CHEMICAL VAPOR DEPOSITION SYSTEM

CROSS-REFERENCE TO RELATED APPLICATION

This application claims the benefit of priority from U.S. Provisional Patent Application Ser. No. 60/346,005 entitled "Massively Parallel ALD/CVD System" filed on Oct. 29, 2001.

FIELD OF THE INVENTION

The present invention relates to semiconductor processing and, more particularly, to an apparatus and method for providing a massively parallel ALD/CVD system.

BACKGROUND OF THE RELATED ART

Chemical Vapor Deposition (CVD) is a widely used deposition process for the growth of thin films on various substrates, including semiconductor wafers. As microelectronics device dimensions are reduced, or scaled down, CVD is an attractive method for the deposition of conformal films over complex device topography. In the field of atomic/molecular level film deposition, a process known as Atomic Layer Deposition (ALD) has emerged as a promising candidate to extend the abilities of CVD techniques. Generally, ALD is a process wherein conventional CVD processes are divided into separate deposition steps that theoretically go to saturation at a single molecular or atomic monolayer thickness and self-terminate. For ALD applications, the molecular precursors are introduced into the reactor separately. Typically, an ALD precursor reaction is followed by inert gas purging of the reactor to remove the precursor from the reactor prior to the introduction of the next precursor.

Commercial ALD systems today include those with a precursor inject flow with respect to the substrate, such as a semiconductor wafer, of "horizontal" or a "vertical" flow design. In the horizontal flow design, the flow is directed across (parallel to) the surface of the wafer. In the vertical inject design, a purge-pump configuration requires that the gas flow actually have both vertical and horizontal components near to and with respect to the wafer plane.

Horizontal flow reactors generally require, as a minimum, the transport of the exposure pulses of the precursor chemical over the diameter of the wafer, whereas vertical flow reactors allow for axi-symmetric injection of the precursor chemical, so that the transport of the exposure pulses is over the radius of the wafer. This means the trailing edge of the precursors for vertical inject is sharper and may be placed closer to the initial edge of sequential reacting precursors, thus minimizing gas phase reactions. These considerations are important in the design of a practical and efficient commercial ALD reactor.

In order to improve throughput of wafers, the semiconductor industry has employed batch processing. However, as wafer diameters increase (e.g. 200 mm and 300 mm wafer diameters or larger), industry preference is for single wafer processing in a reactor chamber. In reference to ALD processes, batch ALD reactors are believed to be difficult to maintain relative to single wafer reactors, which historically have had the capability for in-situ cleans, at least films made by CVD. Films made by single wafer ALD reactors may also be in-situ cleaned if or when appropriate cleaning chemistry (s) are developed. Accordingly, vertical flow designs may be more preferable for practical ALD systems.

The use of single wafer reactors is also more likely to be accepted by the semiconductor industry, since single wafer reactors allow for improved uniformity and high throughput for wafer processing over batch reactors. However, one critical limitation for wider acceptance of ALD is the fact that high throughput processes are difficult to realize with single reactor systems.

It would be advantageous to have a single wafer vertical flow reactor that is also compact and low in profile in its form factor, so that the reactors may be stacked one atop another. Multiple stacked reactors would allow higher throughput per system and improve a given unit area of factory floor space per wafer processed.

BRIEF DESCRIPTION OF THE DRAWINGS

Embodiments of the present invention are illustrated by way of example and are not for the purpose of limitation. In the figures of the accompanying drawings, similar references are utilized to indicate similar elements.

SUMMARY

A massively parallel ALD/CVD system is described. A plurality of ALD/CVD reactors have a compact, low vertical profile so that the reactors may be vertically stacked. The stacked deposition reactors are coupled to receive a material, such as a semiconductor wafer, from a load lock unit to place in one of the reactors. In one embodiment, separate load lock units corresponding to the reactors are used, so that the wafer may be vertically positioned to the respective height of the vertically stacked reactors when the wafers are to be located in the load lock.

The vertically stacked ALD/CVD reactors have a low height profile, but allow separate gas inlet at the top of a chamber and separate exhaust at the bottom of the chamber to provide a generally axi-symmetric vertical gas flow across the wafer when the wafer is processed in the reactor chambers. The vertical arrangement allows multiple wafers to be processed separately in module housing the multiple reactors.

In one embodiment, the reactor chamber is formed by placing a top plate and a bottom plate onto a frame. The top plate and the bottom may have a particularly shaped recessed regions to form the top and bottom of the chamber conforming to the particular shape. In one embodiment, the top and bottom of the chamber has a cone-shape to improve the generally axi-symmetric gas flow in the chamber. In another embodiment, horn-shaped chamber is used to provide an option to further improve the gas flow. The low profile reactors are individually constructed with a cover plate integrated with and containing a horizontal input conduit and a base plate integrated with and containing a horizontal conduit for exhaust to minimize the total vertical height of the assembled low profile reactors.

DETAILED DESCRIPTION OF THE INVENTION

In the description below, the present invention is described in reference to various embodiments. The example embodiments are described in terms of depositing film material on a substrate by Atomic Layer Deposition (ALD). Although ALD is described, the method and apparatus may be readily adapted for the practice of Chemical Vapor Deposition (CVD) or variants thereof. However, the practice of the invention is not limited to these processes. Furthermore, the substrate may be of a variety of base materials for depositing subsequent material layers and need not be limited to the deposition of film layers on a semiconductor substrate (wafer). For example, substrates used for manufacture of flat panel displays may readily be the base substrate.

Figure 1:
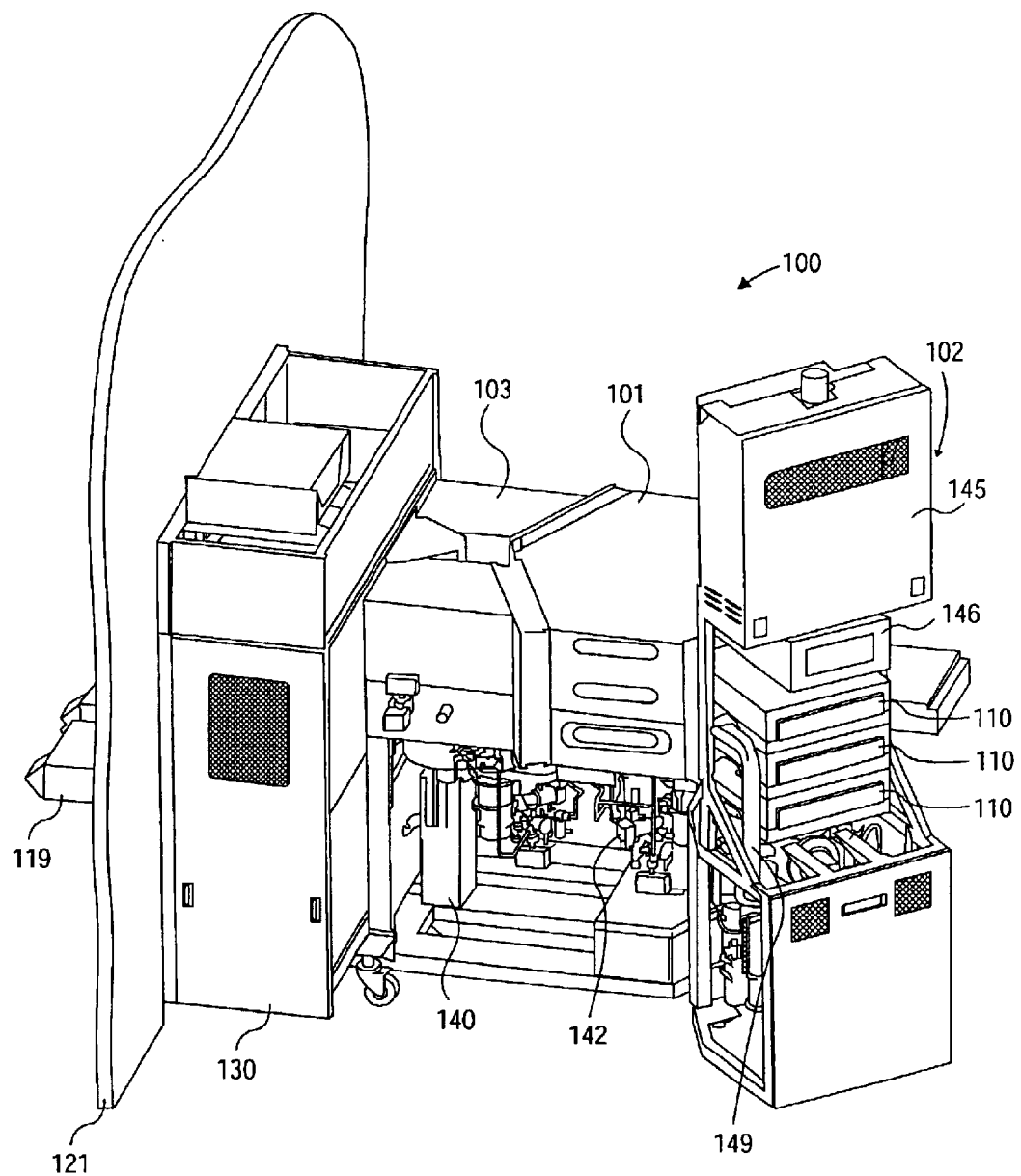
FIG. 1 is a perspective view of one embodiment of a massively parallel ALD/CVD deposition system of the present invention.

Referring to FIG. 1, an example embodiment of a Massively Parallel ALD System (MPAS) 100 is shown. A top plan view and a side plan view of the MPAS 100 are respectively shown in FIGS. 2 and 3 (in FIG. 3, only one process module is shown). MPAS 100 is a complete equipment (tool) manufactured for the purpose of providing deposition of thin film material on to a substrate (either the base substrate or a material layer formed on the substrate). A common substrate is a semiconductor substrate, such as a silicon wafer. Again, as noted above, the MPAS 100 is not limited to ALD or CVD (including plasma assisted ALD or plasma assisted CVD), although the description below pertains to the practice of ALD. The MPAS 100 comprises a number of main assemblies. The MPAS 100 is also illustrated as a cluster tool having a number of assemblies around a common hub. The MPAS 100 may be readily designed to operate in a non-cluster environment, but generally, MPAS 100 is designed as a cluster tool to improve throughput of wafers.

The core architecture of the example MPAS 100 shown includes a central vacuum chamber/platform 101, four process modules 102, load locks 103 and associated connections between the various components and assemblies. As will be described below, the process modules includes three low profile Compact ALD Reactors (CARs) 110, so that a total of twelve such CARs (3×4) are present in the example MPAS 100. The actual number of CARs 110 per process module may vary and may be less than or more than three. Similarly, the number of process modules 102 may vary, so that the total number of CARs 110 for a given MPAS 100 may be less than or greater than twelve.

With the noted design of the MPAS 100 having twelve CARs 110, more wafers may be processed in a smaller footprint area when compared to existing ALD equipment tools. Where productivity is defined as a throughput per unit area of factory floor space, MPAS 100 allows for improved productivity due to the compact design of the CARs 110 and the cluster tool environment. Furthermore, the process capability within a processing chamber of an individual vertical flow compact reactor of the CARs 110 may be made compatible with current thermal and plasma assisted ALD (or CVD) processes, thus, permitting the use of a suitable in-situ clean for continuous operation, as well as plasma assisted CVD or ALD. Other economy of scale features apply, such as common chemical source and pump usage for the stacked reactors in a common process module, which reduces the cost to produce, while still allowing the operation of the independent process modules for high availability of the system operation.

Figure 2:
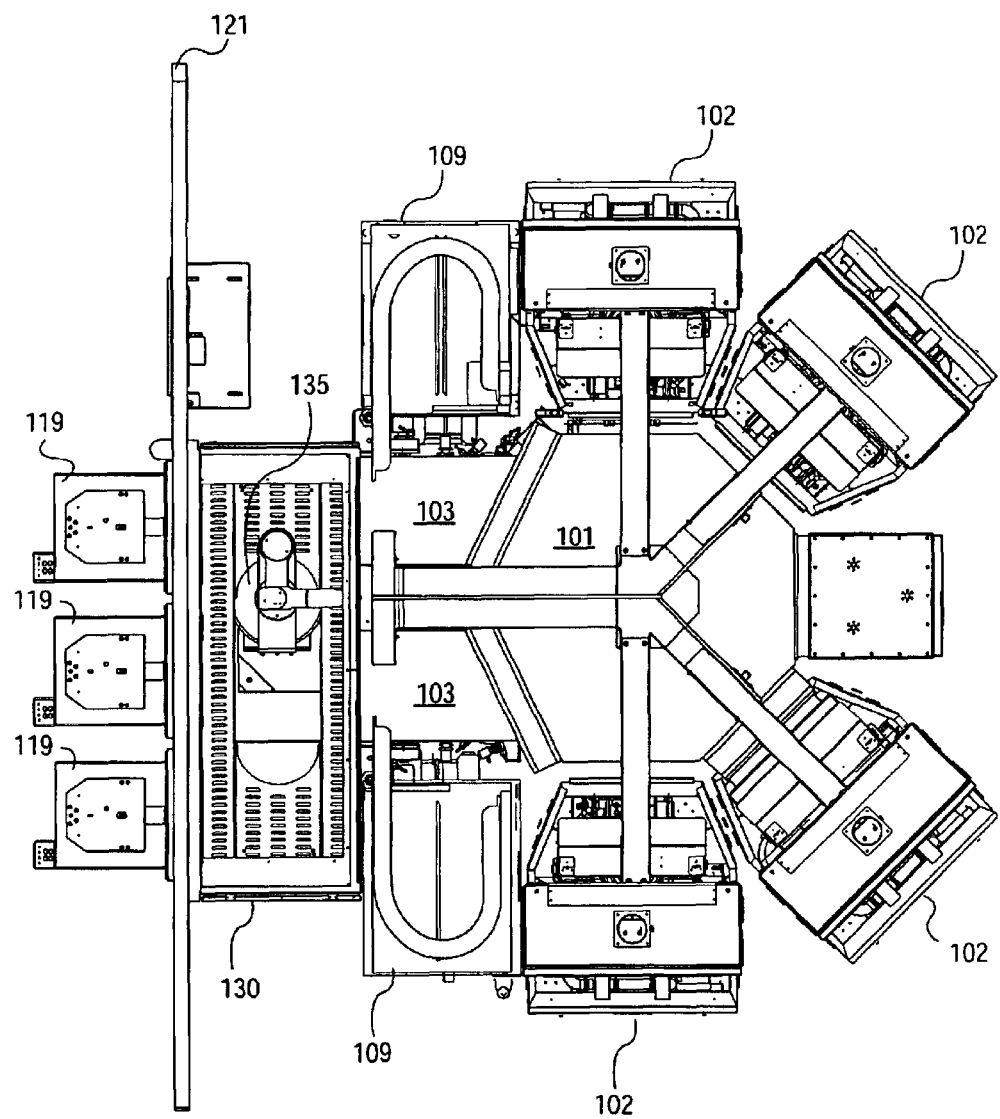
FIG. 2 is a top-plan view of the system of FIG. 1.
Figure 3:
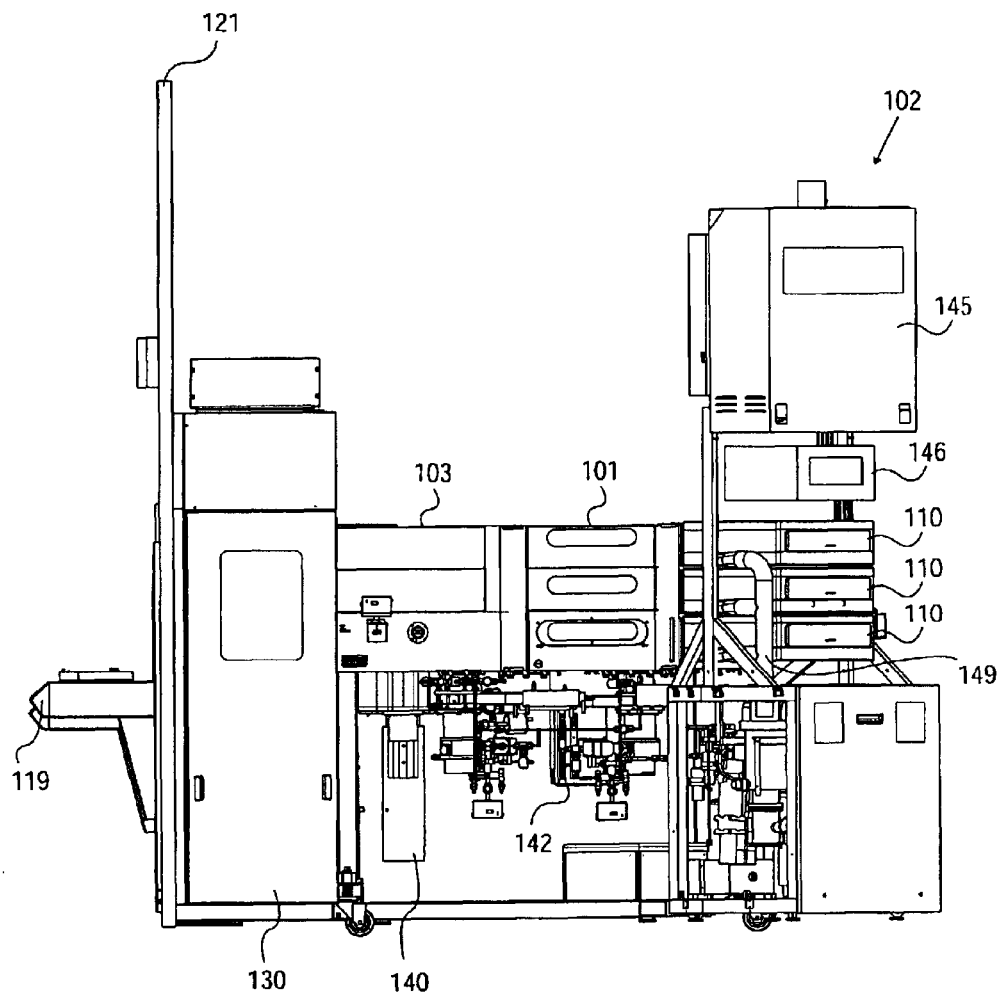
FIG. 3 is a side-plan view of the system of FIG. 1, but showing only one process module.

For a standard semiconductor wafer processing, such as for a 300 mm wafer implementation, a Front Opening Unified Pod (FOUP) allows for a standard mechanical wafer interface to a factory. The FOUP typically resides opposite a wall 121 (or some other partition) and is placed onto a FOUP support 119. The wall 121 separates two environments, one environment for handling/storing the wafer and the other environment where the MPAS 100 is located. The number of FOUP supports 119 utilized will depend on the particular system and, thus, the actual number of FOUPs present will vary. Three such FOUP supports 119 are shown in FIG. 2. A variety of FOUPs known in the art may be readily adapted for use with MPAS 100. It is also to be noted that other wafer loading interfaces may also be utilized to allow the transfer of the wafers from one environment to the environment of MPAS 100. In some instances, a FOUP may not be desired because of its appreciable cost. For example, in certain cases where small piece parts and non-semiconductor materials are employed for processing, other simpler interfaces may be used.

On the other side of the wall 121, a mini-environment interface (referred to as mini-environment 130) is present. The mini-environment 130 is a "clean" entry space (for example, Class 1) between the wafer handling environment and the vertical process module 101. Thus, the FOUPs are linked to the mini-environment 130, so that the loaded wafers are transferred to the mini-environment 130. The mini-environment is used to interface between the atmospheric environment located to the left of the wall 121 (where the FOUPs are located) and the clean environment where the central robotic vacuum chamber 101 and the processing modules 102 are located. Mini-environments of various schemes maybe implemented for the mini-environment 130, including mini-environments known in the art.

In the particular embodiment shown, an atmospheric robot 135 is employed in the mini-environment to move the wafers through the mini-environment 130. In one embodiment the robot 135 is specified with a suitable vertical motion (e.g. approximately 24–36 inches) to accommodate the design for efficient transfer of wafers to the load locks and then to the stacked reactors of the processing modules.

Wafers from the FOUP(s) are loaded into the load locks 103 by the atmospheric robot 135 in the mini-environment 130 using appropriate vertical motion. The load locks 103 have vertical positions that at least at one time in the wafer transfer operation nominally match the vertical positions of the vertically stacked CARs 110. Thus, load locks 103 shown are vertically stacked to correspond to the vertically stacked CARs 110. However, common load lock chambers (not vertically stacked) may also be used in other designs, wherein the load lock is provided with a vertical vacuum movement mechanism for the wafers in the load lock, so that wafers may be placed approximately to match the vertical positions of the center-line position of the stacked reactors. The number of load locks 103 to be used may vary from system to system.

A central robot (not shown) is located within the central vacuum chamber 101 and directly above a robot(s) control housing 142. The vacuum robot may or may not be an industry standard component known in the art, however, it may be modified so that it uses multiple end effectors so as to pick and place more than one wafer at a time from the load lock position to transfer wafers to the CARs 110. The central vacuum robot may take one or more wafers at a time from load lock chambers (less than or of the order of 1.5× the diameter of the wafer and a height defined by the number of wafers to be accommodated by the load lock). For example, if there are 24 wafers in each FOUP, and there are 2 load locks, there may be 36 wafers placed in each load lock 103. The load locks are generally placed about the same horizontal plane or level as the centerline of the CARs 110. Options for robotic transfer for one or more wafers under one loading motion are possible. For example, 3 wafers may be removed from the load lock 103 and placed into 3 stacked CARs 110 of one process module 102 in one transfer loading motion or operation. This operation may be sequentially repeated for supplying wafers to the other process modules. During the time of transfer of wafers to the CARs 110 of the second (and other) process module(s), ALD deposition process may take place in the previously wafer loaded process module(s).

Thus, the central vacuum chamber 101 includes vacuum robots to transfer wafers from the load locks 103 to the CARs 110. A central vacuum robot control unit 142 may be attached to the bottom of the central vacuum chamber 101 and a second central robot may be attached to the top of the central vacuum robotic chamber 101 for increased flexibility.

It is to be noted that one or more of these robotic units may be designed to have movement in the up-down direction (z-direction). The atmospheric robot 135 in the mini-environment 130 may have z-direction movement, so that the wafers may be loaded to the correct height in the load locks 103, and a control mechanism 140 for vertical motion of wafers within the load lock 103 so as to align at the appropriate height for the corresponding CAR 110. In general, there are options to transport wafers to the CARs by the single motion or combined vertical motion of the atmospheric robot in the mini-environment 130, load lock 103, and/or the central vacuum robot(s) in the central vacuum chamber 101. It is also to be noted that with the embodiments described above, the wafers when transported to or within the location of the load lock(s) 103, may be vertically positioned already for entry into the corresponding CAR 110, so that significant movement beyond that for placement (or handoff) within the reactor(s) (generally in the order of approximately 1 cm) is not required of the robot(s) in the central vacuum chamber 101.

The central vacuum chamber 101 is positioned as a hub for the four process modules 102 arranged around the periphery. Again the number of such process modules 102 may vary and the exact layout will depend on the particular footprint. However, a typical layout is the arrangement shown in FIG. 2. The wafers are then moved from the central vacuum chamber 102 into individual CARs 110.

The process modules 102 houses the CARs 110 in a stacked arrangement and typically disposed so that the CARs 110 are aligned with the horizontal movement of the wafer from the load lock 103. A chemical source 145 is shown located above the process modules 102 to source the various chemicals to the CARs 110. A delivery unit, in form of a gas switching manifold 146 reside between the chemical source 145 and the CARs 110 to control the switching in/out the precursor chemicals being sourced to the CARs 110. Although individual chemical sources 145 are shown for each process module 102 in the example embodiment, other embodiments may employ a common chemical source for delivery of the chemical(s) to all of the process modules 102. If a common chemical source is utilized, the source may be placed in a variety of remote locations. If placed semi-remotely (away from the overhead projection of a process module 102, but still within or nearly within the overhead projection of the cluster platform), the chemicals may be in a common source "box" that contains all the individual chemical sources for the process modules 102.

It is to be noted that a given process module 102 has the chemical source 145, gas switching manifold 146 and the CARs 110 disposed in a vertical arrangement to provide a smaller footprint on the factory floor. Likewise, much of the machinery (e.g. the robotic units and control units) are placed below the load locks 103 and the central vacuum chamber 101, as well as with the module 102. Furthermore, shown in FIG. 2 (but not in FIGS. 1 and 3) are electronic control racks 109, which may house various electronic components, controls, etc. In some systems, these control racks 109 may be removable to allow access to the cluster hub, such as for performing maintenance.

In the particular embodiment shown, the chemical source 145 is located in the elevated location above the level of the uppermost reactor of a particular process module 102. The elevated chemical source 145 operates as a common chemical source for the corresponding CARs 110 of the same process module 102. The chemical source 145 supplies precursors for the grouped of stacked CARs 110 of the respective process module 102, by using time phased control sequence. One such control sequence is described below in reference to FIG. 8 for an ALD process.

Figure 4:
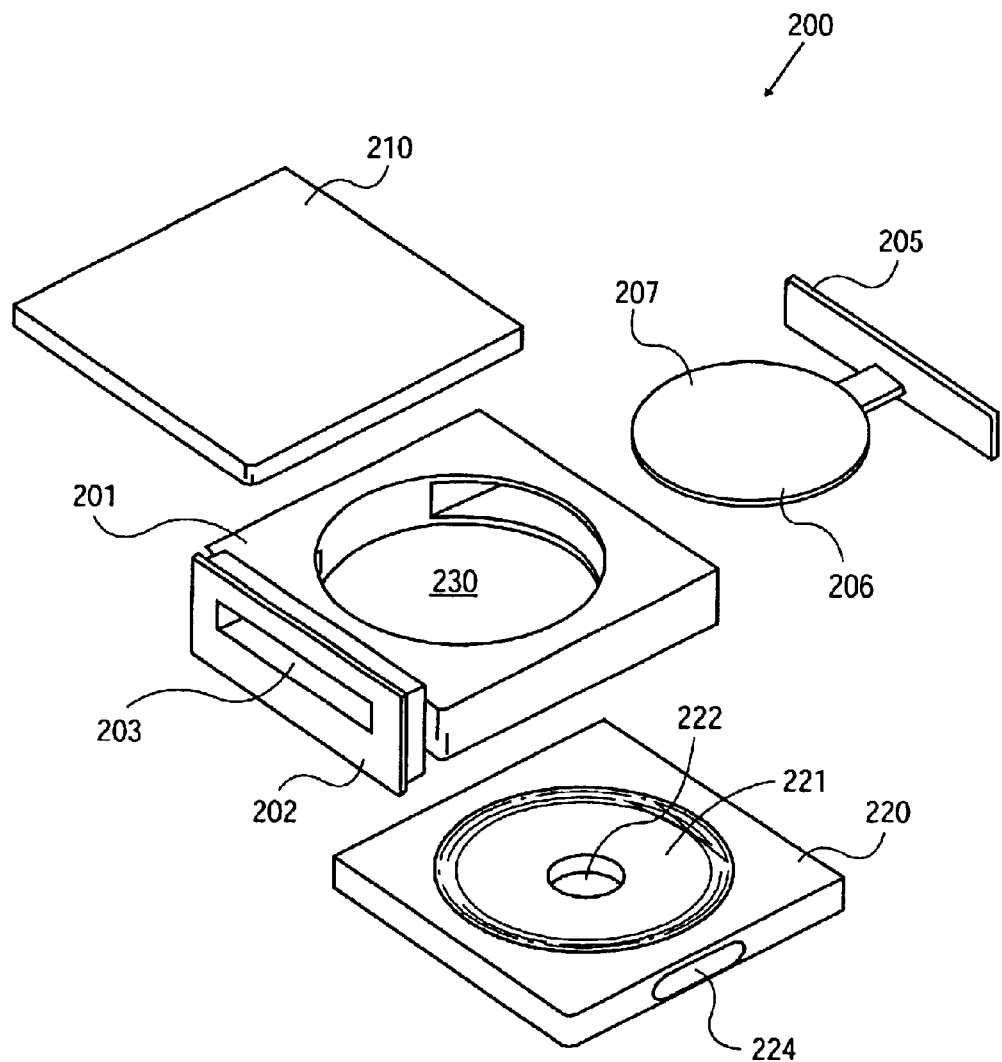
FIG. 4 is an exploded view of an embodiment of a compact ALD reactor for the system shown in FIG. 1.
Figure 5:
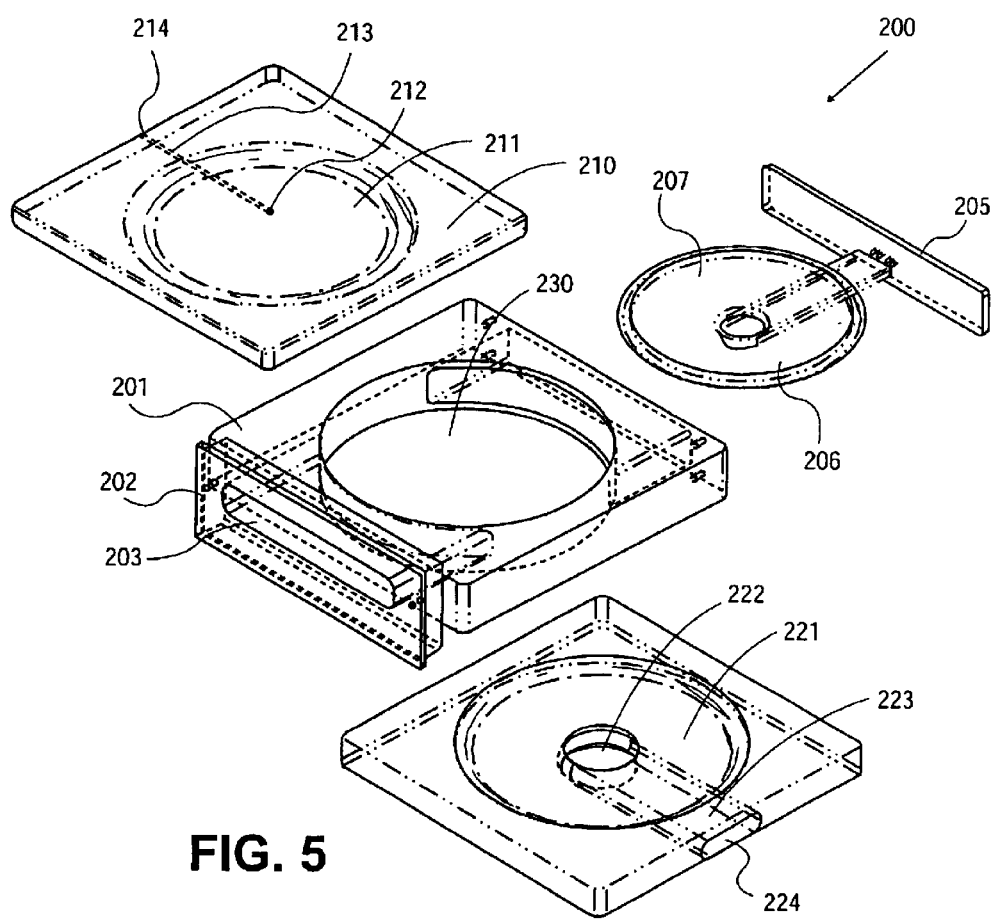
FIG. 5 is an exploded sectional-view of the embodiment of the compact ALD reactor shown in FIG. 4.

FIGS. 4 and 5 illustrate one example embodiment 200 of the CAR unit 110 described above. The CAR unit 200 generally has a low profile with regard to its height dimension, as compared to its length and width dimensions. However, larger height reactors may be employed, although such larger height profile reactor units may limit the number that may be stacked and/or increase the overall height of the process module 102. In one embodiment, the CAR unit's lateral dimensions may be targeted for approximately 1.3× to 2× the wafer diameter to be processed. The height may targeted for 0.5× to 1.0× the lateral dimensions, however larger than 10× may also be useful for a limited number of stacked reactors.

FIGS. 4 and 5 show an exploded view, in which a main body (or frame) 201 has a low profile. The low profile is defined by the height being equal or less than the width and length (cross section dimension) of the CAR unit 200, with a first side 202 using a wafer slot 203 to define a reference side of the CAR frame. A heater assembly piece 205 is shown opposite the first side 202. In other embodiments, the heater assembly piece 205 may be adjacent the first side 202. A heater 206 and a susceptor 207, upon which surface where a wafer is placed, are coupled to the heater assembly piece 205. Once in position with the frame 201, a wafer may be inserted through the slot 203 and made to reside atop the susceptor 207 and heated by heater 206. Typically, with the described embodiment, an end effector of the wafer handler vacuum robot lifts and places the wafer on the susceptor 207. The other remaining sides of the frame 201 are enclosed. The heater 206 is coupled to a heating source, such as electrical power, so that when applied, a wafer resident on the susceptor 207 is heated. A resistive heater element may be used for example to provide wafer temperatures from 100–500 degrees C. CAR wall temperatures may be controlled to a temperature approximately 80–140 degrees C. to minimize the adsorption of sticky reactive species, such as water or $NH_3$.

The CAR unit 200 also includes a cover plate 210 and a base plate 220. The cover plate 210 resides atop the frame 201 to enclose the frame 201 from the top. Likewise, the base plate 220 encloses the frame 201 from the base (bottom). The frame 201 has a cavity region, which when enclosed by the top and base plates 210, 220 operates as a processing chamber 230 for the wafer. Accordingly, when a wafer is inserted through the wafer slot 203 and placed atop the susceptor 207, the wafer is in position in the processing chamber 230 and may be heated by driving electrical power to a resistive heater and allowing the wafer to reach temperature by thermal conductive and/or radiative heat transfer.

As detailed in FIG. 5, the base plate 220 includes a recessed region 221, which has an exhaust opening 222 at or proximal to the center of the recessed region 221. An exhaust conduit 223 extends from the opening 222 to a side of the base plate 220, where an exhaust port 224 is present. The exhaust conduit 224 is shown in FIG. 5 to extend to a side perpendicular to the wafer slot opening 203. As noted, the exhaust conduit 224 is disposed horizontally and, in the example, integrated with the base plate 220. In the particular embodiment, the conduit 223 is axi-symmetric, although various other shapes and sizes may be readily implemented.

The cover plate 210 also includes a recessed region 211, which has a source opening 212 at or proximal to the center of the recessed region 211. A source conduit 213 extends from the opening 212 to a side of the top plate 210, where an inlet port 214 is present. In the particular example, the source conduit 213 extends to the side opposite the exhaust conduit 224. As noted, the source conduit is disposed horizontally and, in the example, integrated with the cover plate 210. Also in the particular example, the conduit 213 leading to the inlet port 214, couples to gas injection lines to introduce precursors and inert gas. Although a single source conduit 213 is shown, multiple conduit lines, openings and/or ports may be used.

The heater assembly piece 205, base plate 220 and cover plate 210 are shown assembled in a particular arrangement in FIGS. 4 and 5. That is; the heater assembly piece 205 is assembled and placed opposite the wafer slot 203, the exhaust port 224 is to the right of the wafer slot 203, and the inlet port 214 is to the left of the wafer slot 203. However, the assembly and configuration may be made in a variety of other any combinations. When completely assembled, the various components form the CAR unit 200.

Figure 6:
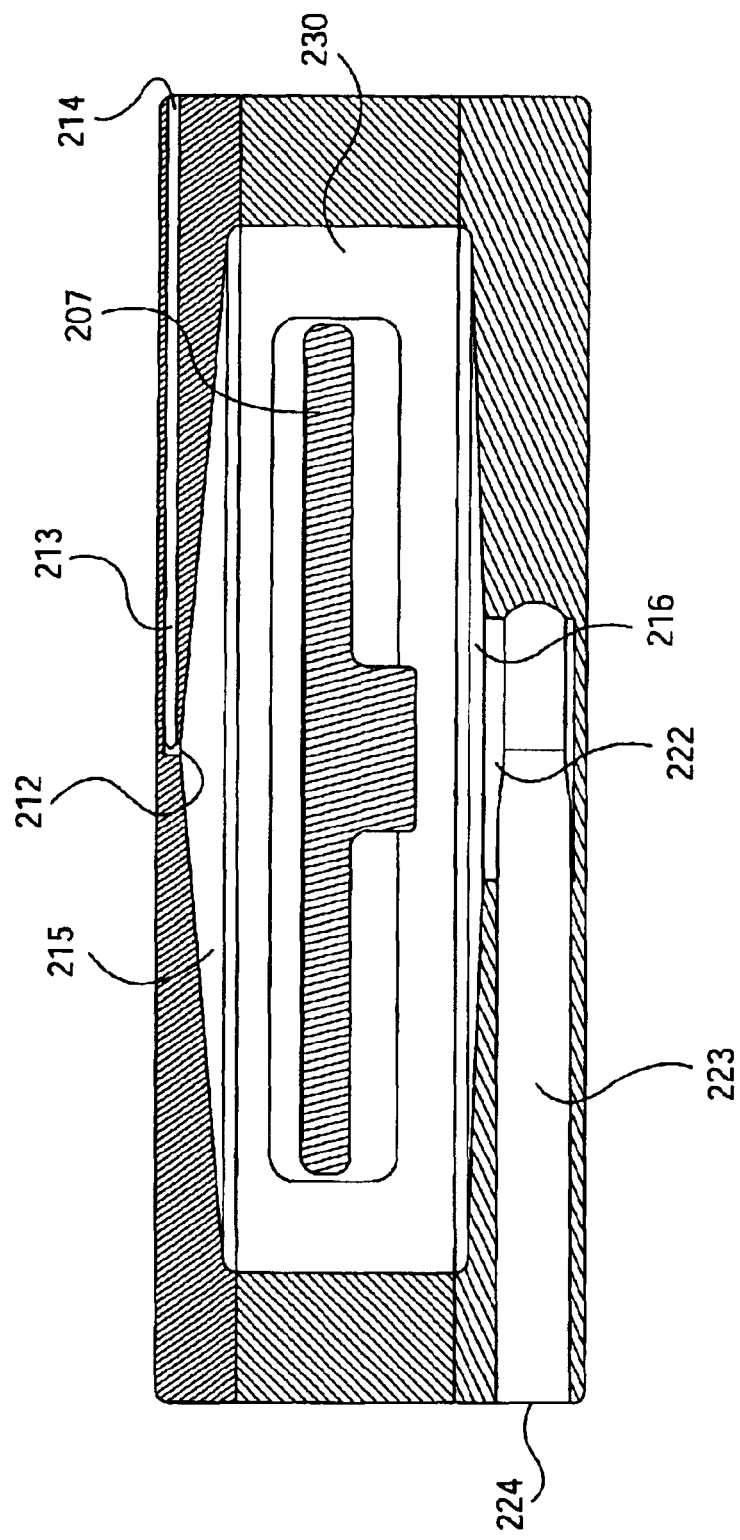
FIG. 6 is a cross-sectional view of an assembled compact ALD reactor having a cone-like shape near the gas inlet and exhaust to improve gas flow in the chamber.
Figure 7:
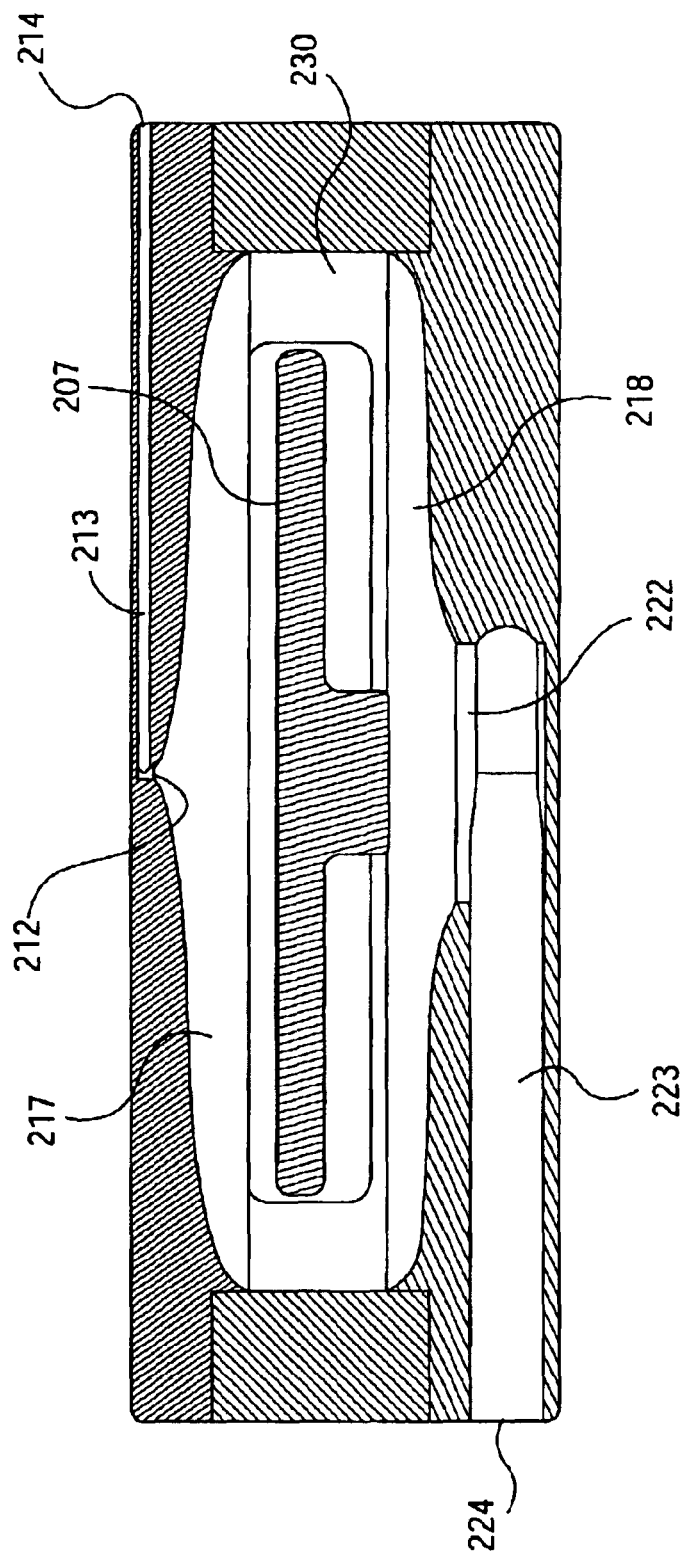
FIG. 7 is a cross-sectional view of an assembled compact ALD reactor having a horn-like shape near the gas inlet and exhaust to improve gas flow in the chamber.

When assembled, the various components units 201, 202, 205, 207, 210 and 220 form the CAR unit 200. Cross-sections of the assembled CAR unit 200 are detailed in FIGS. 6 and 7. FIGS. 6 and 7 differ in that the recessed regions 211 and 221 have different shapes. In FIG. 6, the cover plate 210 and the base plate 220 have a cone-shaped recessed regions 215, 216. In FIG. 7, the two plates 210, 220 have a shape which is convex near the source and exhaust openings 212, 222 and concave near the near the side walls of the chamber 230. This convex-concave shape is referenced as horn-shaped and form horn-shaped regions 217, 218.

It is to be noted that a feature of the CARs illustrated in FIGS. 6 and 7 for describing the low profile reactor is that it is constructed with a cover plate integrated with or containing the horizontal conduit 213 for input of reactants and purge gases and with a base plate integrated with or containing the horizontal conduit 223 for exhaust of chemical by-products, unused reactants and purge gases. This integrated construction reduces the total vertical dimension that would otherwise be obtained by the use of separate input and exhaust lines that are not integrated within the body of the CARs illustrated in FIGS. 6 and 7. Separate horizontal conduit input and exhaust lines that are not integrated within the cover and base plates would most likely require additional hardware and assembly distance(s) above and below the reactor upper and lower surfaces. The novel design minimizes the total vertical height of the assembled low profile reactors and allow the CARs to be stacked more effectively.

As noted in FIGS. 6 and 7, the inlet of the source gases (precursor and/or inert gas) is at the top of the chamber 230 at the source opening 212 and the exhaust is at the exhaust opening 222. The wafer resides centrally between the two openings 212, 222. This vertical flow of gases allows generally axi-symmetric flow across a radius of the wafer when ALD (or CVD) is performed on the wafer. The generally axi-symmetric vertical gas flow achieves generally axi-symmetric conditions for better uniformity control via parasitic CVD control. This condition is desirable to minimize the effect of etching of downstream exchange reaction ALD by-products that may more adversely take place in a horizontal flow arrangement, and to allow simultaneous provision for plasma processes for initiation and plasma assisted ALD. It also provides reduced broadening or dispersion of reactant pulse characteristic allowing for minimal purge time for sequential reactant separation and lack of gas phase reactions.

Furthermore, the vertical flow CAR unit 200 has internal reactor configuration designed with a first generally axi-symmetric horn-like or cone-like inject surface shape to confine and distribute the reactants and inert purge gases and a second horn-like or cone-like surface for obtaining generally axi-symmetric pumping flow for exhaust. The selection of low aspect ratio cylindrically symmetric generally axi-symmetric cone or horn like surfaces are used to help reduce the height and eliminates dead spaces from the corners of the reactor chamber 230. Below the heater assembly, the reverse cone or horn shape surface provides high conductance conduit pathway to the exhaust and limits the desorbtion effects related to back-streaming from dead space to the region above the wafer. The cone or horn like shape have very low aspect rations (height much less than the diameter) to enable the performance of the vertical flow, low profile compact reactor concept. It is to be noted that other surface shapes may also be implemented and the cover and base plate recessed shapes need not be limited to cone or horn like shapes for achieving improved flow.

Figure 8:
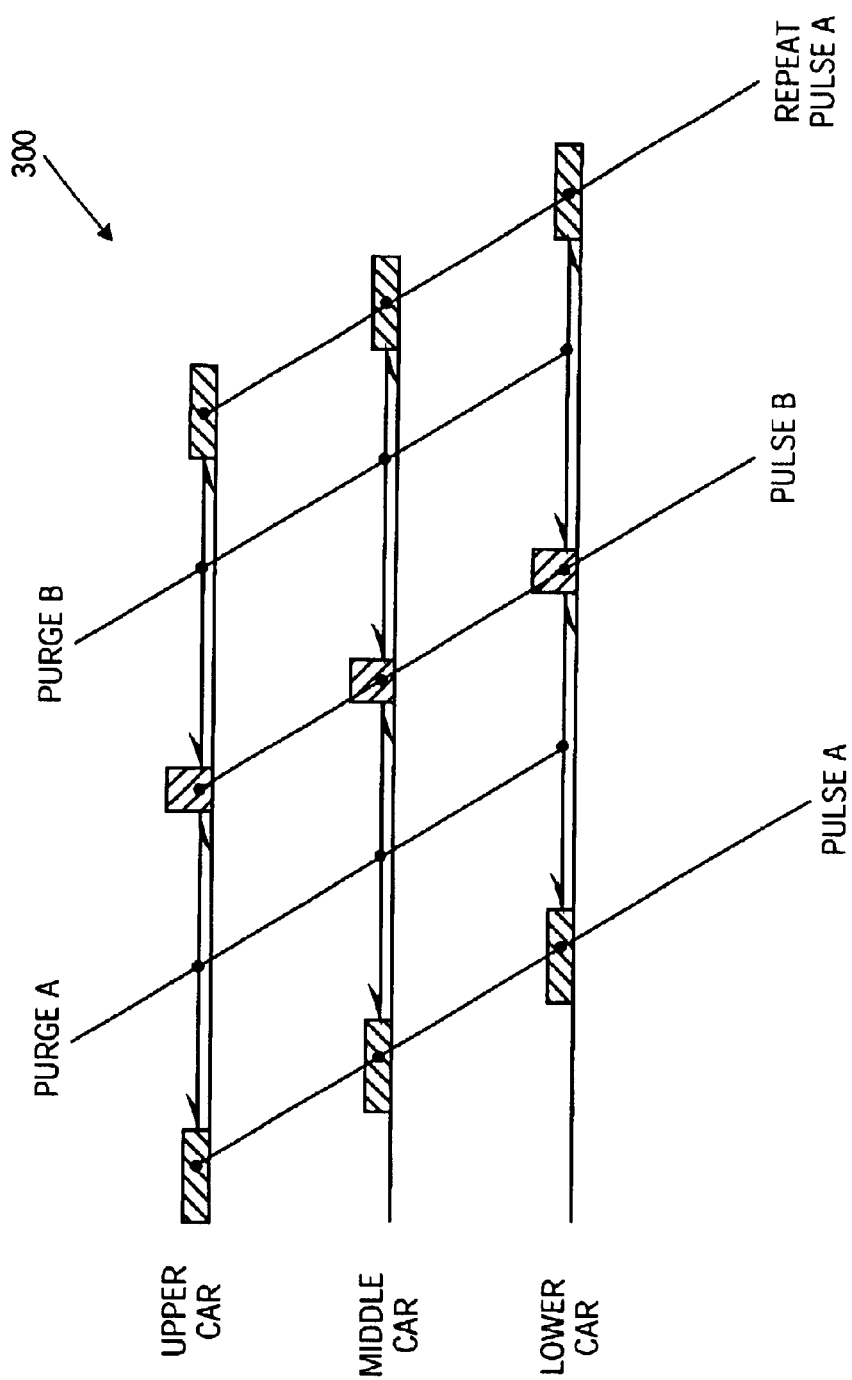
FIG. 8 is a timing diagram showing a time phased control of chemical pulses and purges for a three-stack reactor module for the system of FIG. 1.

Referring to FIG. 8, an example ALD gas switching sequencing diagram 300 is shown for a stack of three CAR units 200. The precursor chemicals are delivered to the CARs 200 from a gas switching manifold (such as manifold 146 shown in FIG. 3). In such an example ALD sequencing, the pulse sequence is: precursor A-purge A-precursor B-Purge B. These four sequences comprise the "ALD cycle."

For example, in a stack of three CAR units 200, the upper reactor is pulsed with an A precursor first and the A pulse is completed before the center reactor is A pulsed, and the lower reactor is A pulsed after the center reactor has completed it's A pulse. Each sequentially A exposure draws precursor from a common chemical precursor source for its process module. Subsequently, the sequence of pulses is repeated for the second precursor B. In between the A and B precursor injection pulses, purge gas flows in the chamber to remove the earlier precursor or any byproducts before the new precursor is introduced.

Thus, a novel vertical flow CAR integrated with MPAS is described with gas inlets and outputs vertically configured into and out of the processing chamber. The low profile allows compact stacking to place multiple reactors in parallel, allowing for dense reactor packing and easy maintenance, but with separate gas injection into and outflow from the reaction chamber, which flow is generally axi-symmetric. The reactor has external geometry that is low profile and substantially rectilinear in its envelope surface.

Furthermore, CARs may be rack mounted, one over the other in a process module to make a vertical stack of independent reactors, so that each reactor may be designed to be removed in a horizontal plane, while the other reactors may continue operation. Precursor and inert purge gases are fed horizontally thru elements 214 and 213 and the exhaust pump flows are carried out horizontally through elements 223 and 224 with respect to the exterior of the CAR to facilitate integration. However, the interior reactor gas flows are vertical with respect to the wafer surface. The exterior shape or form factor of the CAR may be square, rectilinear, round or some other shape. Thermal engineering may be utilized to compensate for proximity effects of upper and lower reactors being in a different thermal environment than the interior (such as the center reactor unit of a three-reactor stack), such as to control the wall temperatures and to assure reactor matching.

Stacked reactors in a given process module may be pumped by being connected to a common or shared pump line. Various options including the combination of dedicated connecting pump lines and shared line (such as a shared manifold line 149 shown in FIG. 3) defines the pump manifold. Individual pumps for individual reactors may also be used. A pump line connecting to an individual CAR may have a line with a shut-off valve and controlling throttle valve in series to their dedicated CAR chamber; the throttle valve achieving a desired set point value or range of values of pressure in each reactor, which can be nominally the same.

A reactor is fed its reactant and purge gases by its own dedicated manifold line or as an alternative, use a shared manifold line. One embodiment has an arrangement with its last reactant and inert gas switching valves "close" to each reactor for implementation of rapid gas switching and to the extent possible a similar distance from each inlet orifice leading to the CAR reaction space to achieve matched process performance. Also, individual CAR units may have remotely operable vacuum valves at its wafer input side to be opened for wafer transport into or out of the reactor and closed for process operation of the reactor.

Finally, the MPAS may be computer or processor controlled. Individual stacks of CARs may share a common pump manifold with a single mechanical pump. Individual CARs may be isolated from cross talk with an independently controlled isolation valve for pressure control and gas flow. The process pressure control is independently controlled via hardware and software, such that closed loop pressure control may be permissible from 0 to 10 Torr without affecting the process (deposition or in-situ clean) on the other CAR modules. Also, wafer temperature control from 100 degrees C. to 500 degrees C. and plasma deposition from 10 watts to 1 KW is in-situ plasma clean is independently controlled without significant crosstalk within the stacked or clustered CARs.

Applications in Alternative Low Cost Manufacturing

In the practical MPAS system described above, the work piece may be a large silicon wafer, (such as a 200 mm or 300 mm wafer). In such cases where robotic wafer transport is not rate limiting, throughputs may be doubled or more compared with state-of-the-art high productivity systems and are particularly well designed for certain ALD applications. These applications would be led by barrier films for interconnect applications, which may have to be 50–100A, but with ALD deposition rates which are not as large as certain dielectrics. TiN, for example using $TiCl_4$ and $NH_3$ has a deposition rate of about only 0.4A/cycle, providing about 3 wafers/hr/module for the desired thickness. Thus, a 6 module system may produce only about 18 wph/system, whereas the MPAS provides of order 36 wph/system, that is more suitable for interconnect manufacturing. Since interconnect designs may have 7+ levels of metallization and a level may require the use of an ALD barrier layer, the system cost is prohibitive with the lower ALD system throughput. These MPAS implementations are well suited to semiconductor manufacturing of large area, highly complex chips, such as those of 1 to 2 $cm^2$ and containing billion level transistor component counts, and where the film is used many times for the fabrication of each device and wafer.

The cost of a 300 mm starting wafer is more than nominal and unlikely to be reduced using current silicon crystal pull, cut and polish manufacturing methods. The cost of the wafer itself has been rationalized for silicon semiconductor use against the high value of large area chips using large wafer.

However, some applications may benefit from the use of small wafers, which may cost much less. For example, a 100 mm (4 inch) silicon or compound semiconductor substrate. If a device, such as a system on a chip or a any small commodity part or component may have a cost to produce of only a few dollars, then the MPAS might be used without a FOUP arrangement or even individual 100 mm wafers. One may use a collection of low cost 100 mm substrates or other small work pieces, such as individual or grouped sets of small parts, components or devices carried on a large area (~300 mm diameter in size) carrier. If 9 such 100 mm wafers were placed on a nominal 300+ mm square carrier, then the productivity is 36×9 or 324 w/hr/MPAS system. This method utilizing large area parallel carrier methods using MPAS and a large number of small form-factor work pieces may be generalized to multiple applications.

Thus, massively parallel ALD/CVD deposition system is described.

We claim:

1. An apparatus comprising:
    a frame having a low vertical profile relative to length and width dimensions and a central opening which forms a center of a processing chamber, said frame having one side opening to receive a material to be introduced into the processing chamber;
    a cover plate having a gas inlet and an inlet conduit integrated within said cover plate, wherein said inlet conduit is disposed horizontally from the gas inlet to an inlet port along a side to couple to a processing gas source; and
    a base plate having an exhaust opening and an exhaust conduit disposed horizontally from the exhaust opening to an exhaust port along a side to exhaust processing gas from the processing chamber.

2. The apparatus of claim 1 wherein said exhaust conduit is integrated within said base plate.

3. The apparatus of claim 1 further including a susceptor in the processing chamber coupled to a side of the frame to have the material reside thereon.

4. The apparatus of claim 3 wherein the susceptor is also a heater to heat the material resident thereon.

5. The apparatus of claim 1 wherein said cover plate and base plate are recessed to have a shaped surface to reduce open spaces along upper and lower corners of the processing chamber to improve processing gas flow in the processing chamber.

6. The apparatus of claim 5 wherein the shaped surface is cone-shaped.

7. The apparatus of claim 5 wherein the shaped surface is convex at a center of the processing chamber and concave at sidewalls of the processing chamber to provide a horn shape.

8. An apparatus comprising:
a plurality of vertically stacked reactors to process a plurality of substrates in which a film material is deposited on the substrates by atomic layer deposition or chemical vapor deposition;
said reactors being comprised of:
(a) a frame having a low vertical profile relative to length and width dimensions and a central opening which forms a center of a processing chamber, said frame having one side opening to receive a material to be introduced into the processing chamber;
(b) a cover plate having a gas inlet and an inlet conduit integrated within said cover plate, wherein said inlet conduit is disposed horizontally from the gas inlet to an inlet port along a side to couple to a processing gas source; and
(c) a base plate having an exhaust opening and an exhaust conduit disposed horizontally from the exhaust opening to an exhaust port along a side to exhaust processing gas from the processing chamber.

9. The apparatus of claim 8 wherein the substrates to be processed are semiconductor wafers.

10. The apparatus of claim 8 wherein said exhaust conduit is integrated within said base plate.

11. The apparatus of claim 8 further including a susceptor in the processing chamber coupled to a side of the frame to have the material reside thereon.

12. The apparatus of claim 11 wherein the susceptor is also a heater to heat the material resident thereon.

13. The apparatus of claim 8 wherein said cover plate and base plate are recessed to have a shaped surface to reduce open spaces along upper and lower corners of the processing chamber to improve processing gas flow in the processing chamber.

14. The apparatus of claim 13 wherein the shaped surface is cone-shaped.

15. The apparatus of claim 13 wherein the shaped surface is convex at a center of the processing chamber and concave at sidewalls of the processing chamber to provide a horn shape.

16. An apparatus comprising:
a frame having a low vertical profile relative to length and width dimensions and a central opening which forms a center of a processing chamber, said frame having one side opening to receive a material to be introduced into the processing chamber;
a susceptor in the processing chamber coupled to a side of the frame and configured to provide heat to the material residing thereon;
a cover plate having a gas inlet and an inlet conduit, wherein said inlet conduit is disposed horizontally from the gas inlet to an inlet port along a side to couple to a processing gas source; and
a base plate having an exhaust opening and an exhaust conduit disposed horizontally from the exhaust opening to an exhaust port along a side to exhaust processing gas from the processing chamber.

17. The apparatus of claim 16 wherein the susceptor is an electric heating element.

18. An apparatus comprising:
a frame having a low vertical profile relative to length and width dimensions and a central opening which forms a center of a processing chamber, said frame having one side opening to receive a material to be introduced into the processing chamber;
a cover plate having a gas inlet and an inlet conduit disposed horizontally from the gas inlet to an inlet port along a side to couple to a processing gas source; and
a base plate having an exhaust opening and an exhaust conduit disposed horizontally from the exhaust opening to an exhaust port along a side to exhaust processing gas from the processing chamber, wherein said exhaust conduit is integrated within said base plate.

* * * * *